US007866784B2

(12) United States Patent
Sleijpen et al.

(10) Patent No.: US 7,866,784 B2
(45) Date of Patent: Jan. 11, 2011

(54) DIAGNOSTIC PROBE ASSEMBLY FOR PRINTHEAD INTEGRATED CIRCUITRY

(75) Inventors: Stephen John Sleijpen, Balmain (AU); William John Stacey, Balmain (AU); Julian Paul Kolodko, Balmain (AU); Neil Fyfe Edwards, Balmain (AU); Neil McAlpin, Balmain (AU); Eric Patrick O'Donnell, Balmain (AU); John Robert Sheahan, Balmain (AU); Jason Mark Thelander, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 315 days.

(21) Appl. No.: 12/193,723

(22) Filed: Aug. 19, 2008

(65) Prior Publication Data

US 2010/0045315 A1 Feb. 25, 2010

(51) Int. Cl.
*B41J 29/393* (2006.01)
*G01R 31/02* (2006.01)

(52) U.S. Cl. ........................................ 347/19; 324/754

(58) Field of Classification Search .................. 347/19; 324/754

See application file for complete search history.

(56) References Cited

U.S. PATENT DOCUMENTS 5,164,747 A * 11/1992 Osada et al. .................. 347/19
5,227,717 A 7/1993 Tsurishima et al.
5,274,336 A * 12/1993 Crook et al. ................ 324/690
5,384,531 A 1/1995 Yamazaki et al.
5,793,218 A * 8/1998 Oster et al. ................ 324/754
6,164,894 A 12/2000 Cheng
6,181,145 B1 * 1/2001 Tomita et al. ............... 324/754
6,300,786 B1 * 10/2001 Doherty et al. ............. 324/765
6,710,590 B1 3/2004 Markert et al.
6,825,680 B1 11/2004 Kogan et al.
7,151,388 B2 12/2006 Gopal et al.
2003/0078748 A1 4/2003 Ayadi
2008/0116910 A1 * 5/2008 Hung ......................... 324/754

FOREIGN PATENT DOCUMENTS

JP 09-330960 A 12/1997

* cited by examiner

*Primary Examiner*—Julian D Huffman

(57) ABSTRACT

The invention provides for a diagnostic probe assembly for a tester which is used to diagnose printhead integrated circuits. The probe assembly includes a support assembly and a controller board mounted on the support assembly and having a processor configured to generate test signals for testing a printhead integrated circuit. A routing board is in operative signal communication with the controller board and is configured to multiplex the generated test signals for respective dies of the printhead integrated circuits. The probe assembly also includes a probe interface in signal communication with the routing board and configured for relaying the multiplexed test signals to and from the respective dies.

5 Claims, 14 Drawing Sheets

DIAGNOSTIC PROBE ASSEMBLY FOR PRINTHEAD INTEGRATED CIRCUITRY

FIELD OF INVENTION

The invention relates to the field of printing, in general. More specifically, the invention relates to testing the alignment of printhead integrated circuits positioned on a carrier.

CO-PENDING APPLICATIONS

The following applications have been filed by the Applicant simultaneously with the present application:

| | | | | | | |
|---|---|---|---|---|---|---|
| 12/193,715 | 12/193,716 | 12/193,717 | 12/193,718 | 12/193,719 | 12/193,720 | 12/193,721 |
| 7,786,723 | 12/193,724 | 12/193,725 | 7,789,477 | 12/193,727 | 12/193,728 | 12/193,729 |
| 12/193,730 | 12/193,731 | 12/193,732 | 12/193,733 | 12/193,734 | 12/193,735 | 12/193,736 |
| 7,721,420 | 12/193,738 | 12/193,739 | 12/193,740 | 12/193,741 | 12/193,742 | 12/193,743 |
| 12/193,745 | 12/193,747 | 12/193,748 | 12/193,750 | 12/193,751 | 12/193,751 | |

The disclosures of these co-pending applications are incorporated herein by reference.

CROSS REFERENCES

The following patents or patent applications filed by the applicant or assignee of the present invention are hereby incorporated by cross-reference.

| | | | | | | |
|---|---|---|---|---|---|---|
| 11/246,687 | 11/246,718 | 7,322,681 | 11/246,686 | 11/246,703 | 11/246,691 | 11/246,711 |
| 11/246,690 | 11/246,712 | 11/246,717 | 7,401,890 | 7,401,910 | 11/246,701 | 11/246,702 |
| 11/246,668 | 11/246,697 | 11/246,698 | 11/246,699 | 11/246,675 | 11/246,674 | 11/246,667 |
| 11/829,957 | 11/829,960 | 11/829,961 | 11/829,962 | 11/829,963 | 11/829,966 | 11/829,967 |
| 11/829,968 | 11/829,969 | 11/946,839 | 11/946,838 | 11/946,837 | 11/951,230 | 12/141,034 |
| 12/140,265 | 12/183,003 | 11/688,863 | 11/688,864 | 11/688,865 | 7,364,265 | 11/688,867 |
| 11/688,868 | 11/688,869 | 11/688,871 | 11/688,872 | 11/688,873 | 11/741,766 | 12/014,767 |
| 12/014,768 | 12/014,769 | 12/014,770 | 12/014,771 | 12/014,772 | 12/014,773 | 12/014,774 |
| 12/014,775 | 12/014,776 | 12/014,777 | 12/014,778 | 12/014,779 | 12/014,780 | 12/014,781 |
| 12/014,782 | 12/014,783 | 12/014,784 | 12/014,785 | 12/014,787 | 12/014,788 | 12/014,789 |
| 12/014,790 | 12/014,791 | 12/014,792 | 12/014,793 | 12/014,794 | 12/014,796 | 12/014,798 |
| 12/014,801 | 12/014,803 | 12/014,804 | 12/014,805 | 12/014,806 | 12/014,807 | 12/049,371 |
| 12/049,372 | 12/049,373 | 12/049,374 | 12/049,375 | 12/103,674 | 12/146,399 | |

BACKGROUND

Pagewidth printers that incorporate micro-electromechanical components generally have printhead integrated circuits that include a silicon substrate with a large number of densely arranged micro-electromechanical nozzle arrangements. Each nozzle arrangement is responsible for ejecting a stream of ink drops.

In order for such printers to print accurately and maintain quality, it is important that the printhead integrated circuits be tested. This is particularly important during the design and development of such integrated circuits.

SUMMARY

According to a first aspect of the invention, there is provided a testing apparatus for testing integrated circuits mounted in a carrier, the testing apparatus comprising:

a support assembly;

a controller mounted in the support assembly, the controller being programmed to process test signals from the integrated circuits;

a retaining assembly arranged on the support assembly and configured to receive and retain the carrier during testing;

a displacement mechanism arranged on the support assembly for displacing the retaining assembly relative to the support assembly into and out of an operative condition, in use; and testing circuitry operatively connected to the controller and having at least test signal generation and measurement circuitry and adaptor circuitry for operative engagement with the integrated circuits being tested, the adaptor circuitry being configured to provide both a physical and an electrical interface with the integrated circuits.

Preferably, the integrated circuits are inkjet printheads.

The support assembly may include a housing assembly, the controller being in the form of a touch-panel PC mounted in the housing to be accessible by an operator, the housing assembly including a table assembly and the retaining assembly including a stage that is displaceable into and out of said operative condition.

The retaining assembly may include a clamp assembly arranged on the stage to clamp the carrier in position prior to displacement of the stage into the operative condition.

The retaining mechanism may include locating formations that are configured to co-operate with locating formations on the carrier to ensure that the carrier is correctly positioned prior to testing.

The adaptor circuitry may include an adaptor board that is configured to engage the printhead integrated circuits and to provide the electrical and physical interface with the printhead integrated circuits.

The signal generation and testing circuitry may include a tester board and a multiplexer board interposed between the tester board and the adaptor board for routing test and control signals between the tester board and the printhead integrated circuits.

The signal generation and testing circuitry may include a reset board for generating reset signals required for multiplexed printhead integrated circuits.

According to a second aspect of the invention, there is provided a method for testing integrated circuits mounted on a carrier, the method comprising the steps of:

securing the carrier;

displacing the carrier into an operative position in which the integrated circuits is in physical and electrical communication with a diagnostic probe;

generating test signals in test circuitry at least in electrical communication with the diagnostic probe and communicating the test signals to the integrated circuits with the diagnostic probe;

receiving the test signals at the test circuitry via the diagnostic probe;

making the received test signals available to a controller via a communications link and an automated server; and displaying a test status with the controller.

Preferably, the integrated circuits are inkjet printheads.

The method may include the step of verifying an identifier of the carrier during the step of displacing the carrier into the operative position.

The step of securing the carrier may include clamping the carrier in a pneumatically operated clamping assembly under control of a programmable logic controller (PLC).

The step of generating the signals may be configured such that a test consisting of one of the following group is carried out on the printhead integrated circuits: a gross Idd test, an Ipos test, a protection diode voltage threshold test, a wirebond continuity test, a leakage current test, a signal input voltage threshold test, a signal output voltages test, and a test for functional vectors.

The method may include the step of relaying the signals to a remote monitoring system. The step of relaying the signals to a remote monitoring system may include the step of relaying the test signals via an Ethernet link connected to the test circuitry.

The steps of communicating and receiving the signals may include the step of multiplexing the signals to rout the signals to and from individual dies in the printhead integrated circuits.

According to a third aspect of the invention, there is provided a stage for a printhead integrated circuit tester for testing operation of printhead integrated circuits mounted on a carrier, the stage comprising:

a support structure;

a fixture arranged on the support structure and configured to receive and locate the carrier;

a clamping mechanism arranged on the fixture, the clamping mechanism having at least one clamp assembly for clamping the carrier to the stage; and a controller for controlling operation of the clamping mechanism.

The fixture may include a base member and dowel pins extending from the base member to facilitate location of the carrier on the fixture, the dowel pins shaped and dimensioned for being received in complementary apertures defined by the carrier.

The base member may be elongate and the clamping mechanism may include two opposing clamp assemblies located on respective ends of the base member.

Each clamp assembly may include a piston and cylinder arrangement mounted on the base member, and a clamp plate pivotally mounted on the base member to be pivoted into and out of a clamping position with the piston and cylinder arrangement.

Each clamp plate may define a clamp finger configured to overlie the carrier when the clamp plate is pivoted into the clamping position.

Each clamp assembly may include a pneumatic coupling for coupling the piston and cylinder arrangement to a pressurized gas supply in order to actuate the clamp assembly.

The controller may be in the form of a programmable logic controller (PLC) configured to control the pressurized gas supply and thus operation of the piston and cylinder arrangements.

According to a fourth aspect of the invention, there is provided a diagnostic probe assembly for a tester which is used to diagnose printhead integrated circuits, the probe assembly comprising:

a support assembly a controller board mounted on the support assembly and having a processor configured to generate signals for testing a printhead integrated circuit;

a routing board mounted on the support assembly and in operative signal communication with the controller board, the routing board configured to multiplex the generated signals for respective dies of the printhead integrated circuits; and a probe interface mounted on the support assembly and in operative signal communication with the routing board, the probe interface configured for relaying the multiplexed signals to and from the respective dies.

The probe interface may include an adaptor board having a converter for converting the signals to printhead integrated circuits electrical signals.

The converter may be configured to generate a reset signal to facilitate multiplexing of the signals to the respective dies of the printhead integrated circuits.

The probe interface may include a push bar to provide rigidity and mechanical support to the interface during engagement of the interface with the printhead integrated circuits.

The routing board may include board connectors for receiving the controller board and adaptor board, the routing board having power circuits for supplying said controller and adaptor boards with electrical power.

The support assembly may include a support plate and brackets extending from the support plate, the controller board being fixed to the brackets and the routing board being fixed to the support plate, which defines an aperture for access to the probe interface.

The processor of the controller board may be configured to generate signals suitable for one of a group of tests consisting of: a gross Idd test, an Ipos test, a protection diode voltage threshold test, a wirebond continuity test, a leakage current test, a signal input voltage threshold test, a signal output voltage test, and a test for functional vectors.

According to a fifth aspect of the invention, there is provided a system for testing integrated circuits, the system comprising:

a local computational device;

a communications link connected to the computational device;

testing circuitry operatively connected to the computational device via the communications link and configured to generate integrated circuitry test signals;

adaptor circuitry connected to the testing circuitry and configured to provide an electrical and physical interface with the integrated circuitry;

routing circuitry interposed between the testing and adaptor circuitry to rout the test signals to respective dies in the integrated circuitry;

a handling mechanism for retaining and manipulating a carrier on which the integrated circuitry is positioned; and a controller operatively connected to the handling mechanism for controlling operation thereof and connected to the communications device for supervision by the computational device.

Preferably, the integrated circuits are inkjet printheads.

The computational device may be a PC with a graphic user interface for displaying test results to an operator.

The communications link may be in the form of an Ethernet switch, the Ethernet switch being connectable to a remote computational device to provide remote access to the local computational device.

The testing circuitry may be in the form of a single integrated circuit test board, the local communications device being programmed to define a test server for communication with the test board.

The adaptor circuitry may be defined by an adaptor board having a printhead electrical interface for physical and electrical engagement with the printhead integrated circuits.

The routing circuitry may be in the form of a routing board configured to multiplex the test signals for the respective dies.

The handling mechanism may include a pneumatically operated clamping mechanism for clamping the carrier securely during testing of the printhead integrated circuits.

The controller may be in the form of a programmed logic controller (PLC).

According to a sixth aspect of the invention there is provided a software product for execution by a controller of a measuring apparatus, as described above, said software product enabling the apparatus to perform the above method.

According to a seventh aspect of the invention there is provided a computer readable medium incorporating a software product, as described above.

Embodiments of the invention are now described, by way of example, with reference to the accompanying drawings. The following description is intended to illustrate particular embodiments of the invention and to permit a person skilled in the art to put those embodiments of the invention into effect. Accordingly, the following description is not intended to limit the scope of the preceding paragraphs in any way.

BRIEF DESCRIPTION OF THE DRAWINGS

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way. The Detailed Description will make reference to a number of drawings as follows.

DETAILED DESCRIPTION

Aspects of the invention will now be described with reference to specific embodiments thereof. Reference to "an embodiment" or "one embodiment" is made in an inclusive rather than restrictive sense. As such, reference to particular features found in one embodiment does not exclude those features from other embodiments.

The following description is intended to assist a person skilled in the art with understanding the invention. Accordingly, features commonplace in the art are not described in particular detail, as such features will be readily understood by the skilled person.

Overview

Broadly, the invention relates to the testing of printhead integrated circuits, such as printhead microchips or integrated circuits (ICs), mounted on a carrier (not shown). The carrier typically includes printing fluid distribution channels to supply the ICs with printing fluids, as well as tape automated bonded (TAB) electrical connections for the ICs. The ICs receive control signals from a printer controller of a suitable printer via the TAB connections. In general, this invention provides for apparatus and methods of testing the electrical connections to the ICs to ensure proper working thereof.

More specifically, the invention includes testing apparatus configured to operatively receive and retain such a carrier and to perform electrical tests in ICs located thereon. The invention also includes a test stage for the tester, a diagnostic probe assembly of such a tester, and a system for testing the carrier with ICs. A test method is also provided for. These aspects are discussed separately below, but the skilled person will appreciate the overlapping between the respective aspects and/or components of the invention.

Testing Apparatus Overview

Figure 1:
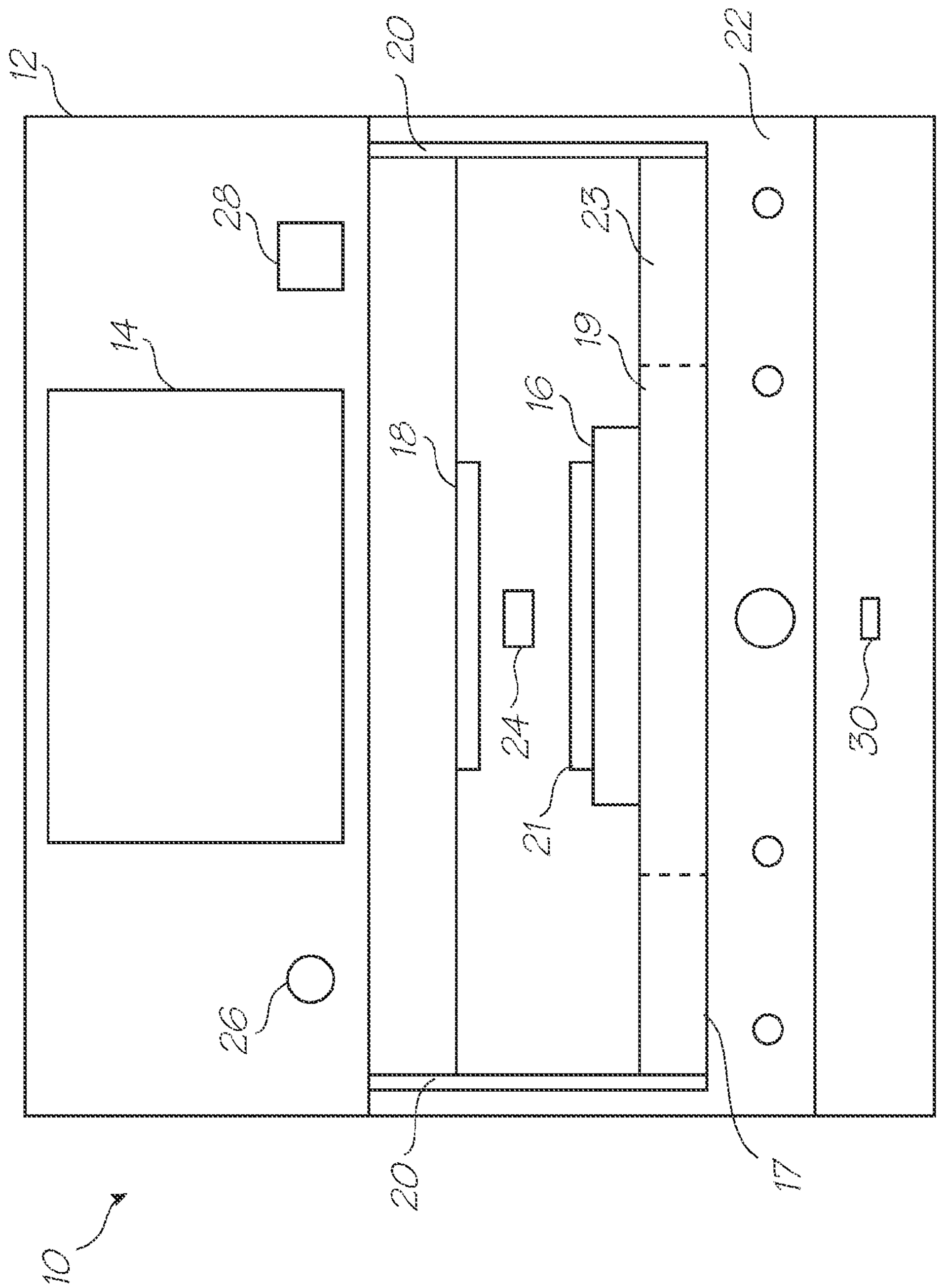
FIG. 1 show a schematic representation of a testing apparatus or tester, in accordance with one embodiment of the invention, for testing printhead integrated circuits mounted on a carrier.

With reference to FIG. 1, one embodiment of a testing apparatus or tester 10 of printhead integrated circuits is shown. The tester 10 includes a housing 12 defining a support assembly 17. A touch panel display computer 14 is housed in the housing 12, as shown, and provides an interface for an operator of the tester 10.

The tester also includes a controller 72 (discussed below) and a retaining assembly 16 for operatively retaining the carrier. A displacement assembly 19 is also provided to displace the carrier retained in the retaining assembly 16 in contact with a test probe contact 18 of testing circuitry of the tester. The controller 72 is programmed to process test signals received from the integrated circuits of the carrier whilst the testing circuitry performs electrical tests thereon.

The test probe 18 of the testing circuitry is operatively connected to the controller 72 and includes test signal generation and measurement circuitry, as well as adaptor circuitry for operative engagement with the integrated circuits being tested. The adaptor circuitry is configured to provide both a physical and an electrical interface with the integrated circuits on the carrier. These components are discussed in more detail below.

The support assembly 17 is supported by the housing 12, and includes a table assembly 23 supporting the retaining assembly 16. The retaining assembly includes a test stage 21 that is displaceable into and out of an operative condition, where the printhead ICs are interfaced with the testing circuitry via probe 18. When the test stage is not in the operative condition, the operator is able to insert or remove the carrier from the retaining assembly 16. The retaining assembly 16 includes a clamping or retaining mechanism 117 (discussed below) arranged on the test stage 21 to clamp the carrier in position prior to displacement of the test stage 21 into the operative condition.

The tester 10 also includes an operator control panel 22 which includes start buttons, a clamp button, a reset button, and an emergency stop button. In one embodiment, the two outermost buttons are the start buttons, both of which must be pressed simultaneously to activate the tester 10. This is a safety feature to prevent accidental activation of the tester 10.

The reset button typically resets the tester 10, which ends any testing and moves the retaining assembly 16 out of the operative condition to a loading position where the carrier can be loaded or unloaded. The clamp button instructs the tester 10, and more specifically the controller 72, to activate the clamp assembly 117 to clamp the carrier to the test stage 21. The emergency stop button is another safety feature which immediately shuts down the tester 10. The inventor has found that buttons manufactured by Sprecher & Schuh are suitable for this application.

It is to be appreciated that the buttons of the operator control panel 22, as well as the touch panel 14, are arranged in signal communication with the controller 72, discussed below. The controller is responsible for performing the actions indicated by the buttons or inputs received via the touch panel 14.

The housing 12 also includes two pressure indicators 26 and 28. It is to be appreciated that the tester 10 includes pneumatic circuits for the displacement assembly 19 and the clamp assembly 117 of the test stage 21. As such, pressure indicator 26 indicates the pneumatic pressure of the clamp assembly 117, and indicator 28 indicates the pneumatic pressure of the displacement assembly 19.

The tester 10 also includes a light curtain 20 safety system controlled by the controller. The light curtain 20 allows the controller to detect when a foreign object is proximate the test stage 21 during testing. When a foreign object is detected, the tester 10 is deactivated to prevent injury.

The housing 12 also includes a computer interface 30, such as a USB socket, via which the controller can communicate with an external computer. A barcode scanner 24 is further provided which is configured to scan a barcode from each carrier tested to store a result of the testing for each particular carrier.

Controller Components

Figure 2:
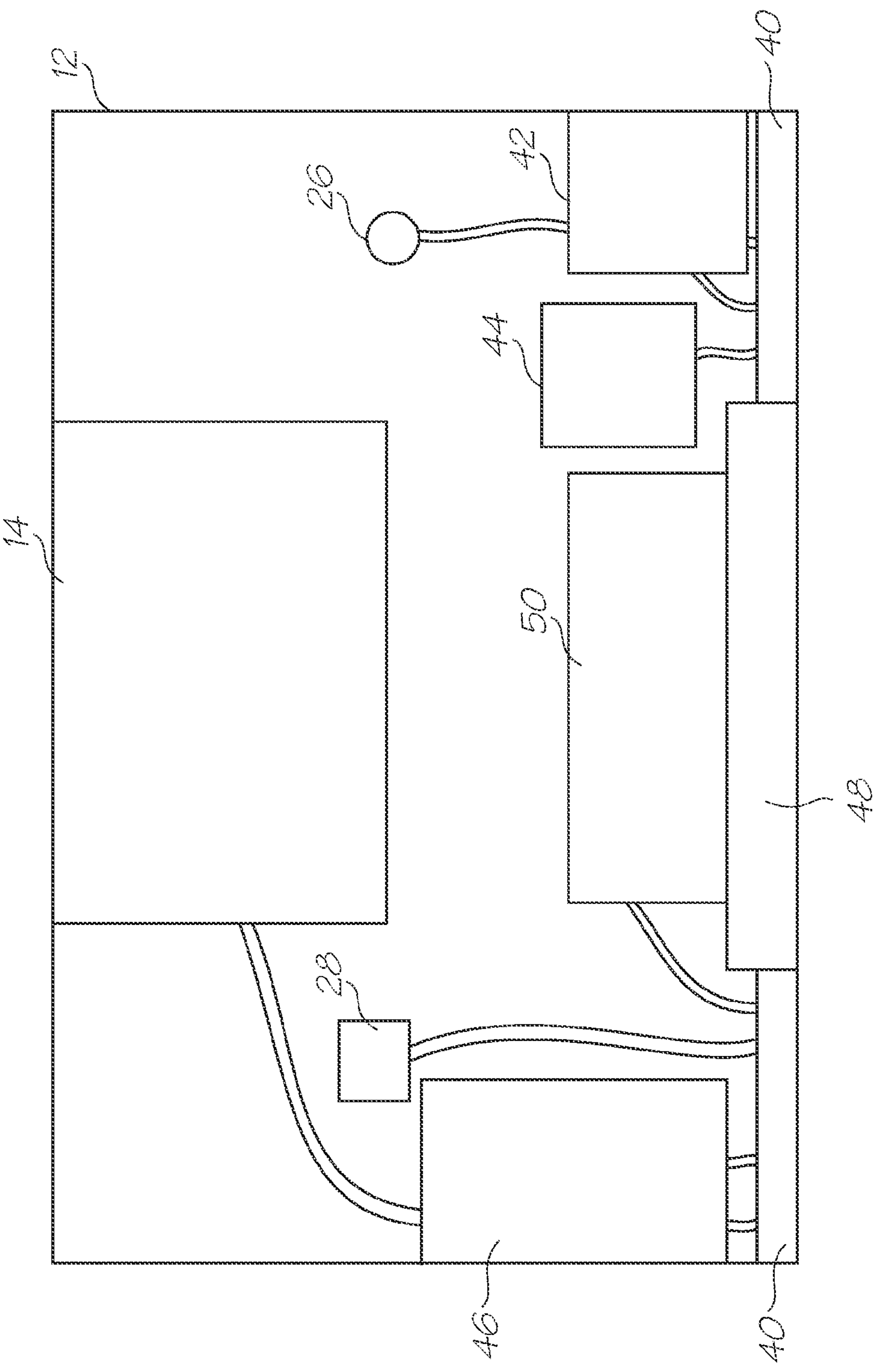
FIG. 2 shows a schematic representation of controller components of the apparatus of FIG. 1.

Referring now to FIG. 2 of the drawings, an upper portion of the tester 10 is shown with a rear upper enclosure of the housing 12 in an open position. The enclosure houses some of the components of a control system managed by the controller.

The flat panel PC 14 can be seen, along with pressure indicators 26 and 28. The inventor has found the Advantech PPC-123T integrated unit to be suitable as flat panel PC 14 for this application. A 5V DC power supply 46 and 9V DC power supply 42 provide electrical power to the electrical components of the control system. The inventor has found the Omron DIN mount switching power supply model no. S8K-00705 to be suitable for the 5V supply 46, and the Cosel PBA50F-9 suitable for the supply 42.

An Ethernet switch 44 connects the flat panel PC 14 and barcode scanner 24 with the controller 72. The Ethernet switch 44 also provides an interface for a remote monitoring system, described below. The inventor has found the Netgear FS605 Ethernet switch suitable for this application.

A controller board 50 and related adaptor, tester and multiplexer boards (collectively indicated by reference numeral 48) can also be seen. The controller board 50 and related boards 48 together form part of a diagnostic probe assembly, discussed below. Trunking 40 is provided to facilitate the electrical and pneumatic connection of components in a neat and easily accessible manner.

Figure 3:
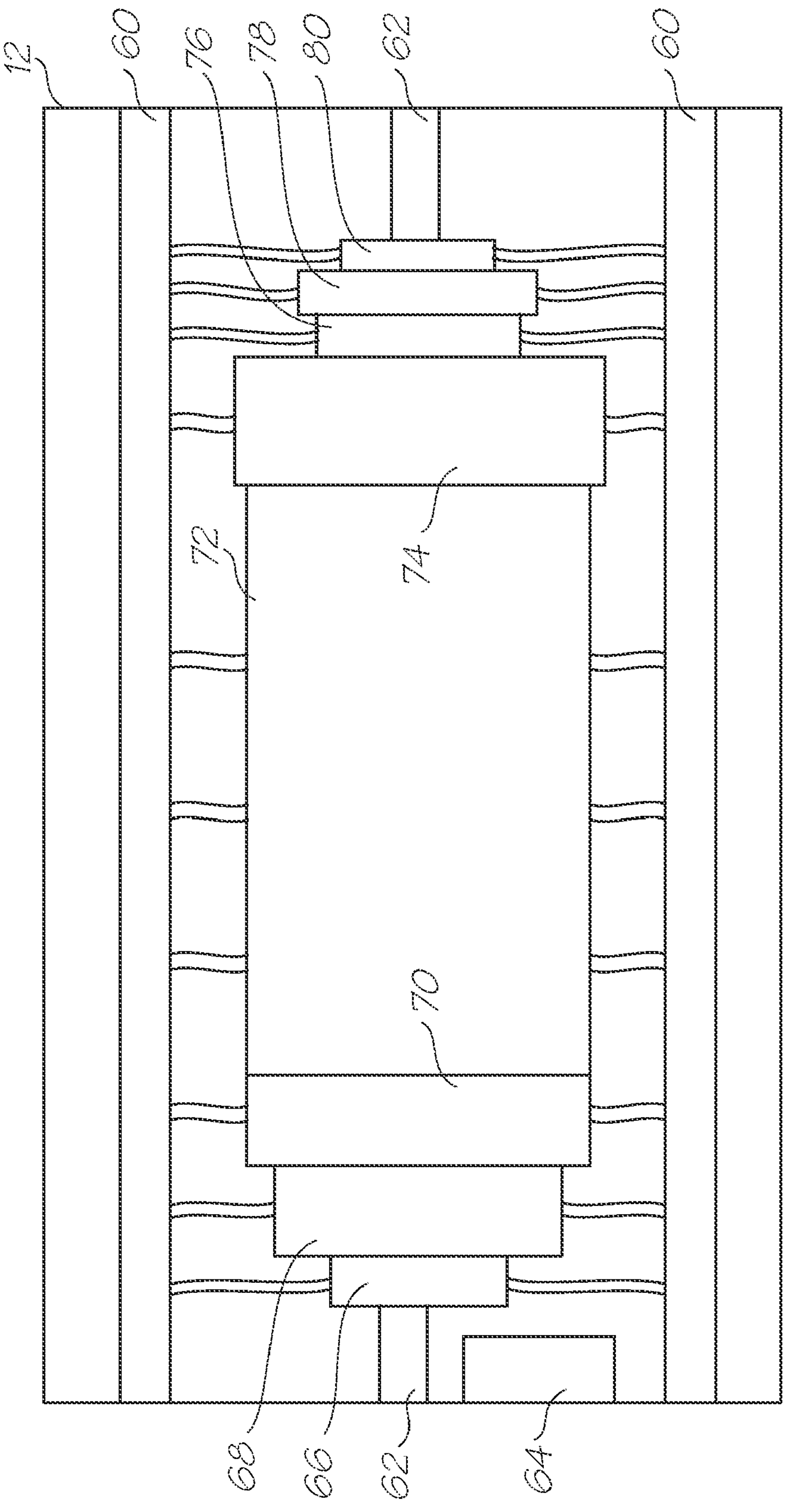
FIG. 3 shows a schematic layout of a controller of the apparatus of FIG. 1.

With reference now to FIG. 3 of the drawings, a lower portion of the tester 10 is shown with a rear lower enclosure of the housing 12 in an open position. The controller 72 is visible, which is a programmable logic controller (PLC). The inventor has found the Mitsubishi FX3U-16M PLC to be suitable for this application.

The PLC 72 is programmable to enable control of the different aspects of the tester 10. The PLC 72 also includes a network communication module 70, which is a Mitsubishi FX3U-ENET module to interface with the Ethernet switch 44, which in turn provides an interface to the plat panel PC 14, the barcode scanner 24, and an external connection to the remote monitoring system, as mentioned above.

The PLC 72 also includes an analog interface module 74 to allow the PLC 72 to interface with pneumatic actuators for the test stage 21 and the displacement mechanism 19 of the support assembly 17. The analog interface module 74 may be a Mitsubishi FX2N-4AD module. The PLC 72 is also arranged in signal communication with the controller board 50 and related adaptor, tester and multiplexer boards 48.

It is to be appreciated that the PLC or controller 72 is responsible for the functions and operations of the tester 10. All the electrical and pneumatic components are under the control of the PLC 72. The enclosure of the housing 12 also includes trunking 60 to facilitate the connection of electrical components in a neat and easily accessible manner. The components are mounted on rail 62, as shown.

As shown, the enclosure also houses a mains power isolation switch 64 to isolate mains AC power, if required. The inventor has found a Sprecher & Schuh model no. LE2-12-1782 isolation switch to be suitable for this application.

Also included is light curtain power supply 68 and associated light curtain safety relay 66. The inventor has found the Keyence SL-U2 24V power supply and the Omron G7S-4A2B DC24 plug-in safety relay to be suitable for this application. Residual current circuit breaker 78 is used to provide overcurrent and earth leakage protection, along with safety relays 76 and fuses 80, which provide additional overvoltage and related electrical protection. The inventor has found a Hager AD 810T circuit breaker along with an Omron G7S-4A2B relay and Wieland SNO 4003K relay suitable for this application.

FIGS. 11 to 14 show circuit diagrams for some of the above components and their interconnection.

Test Stage

Figure 6:
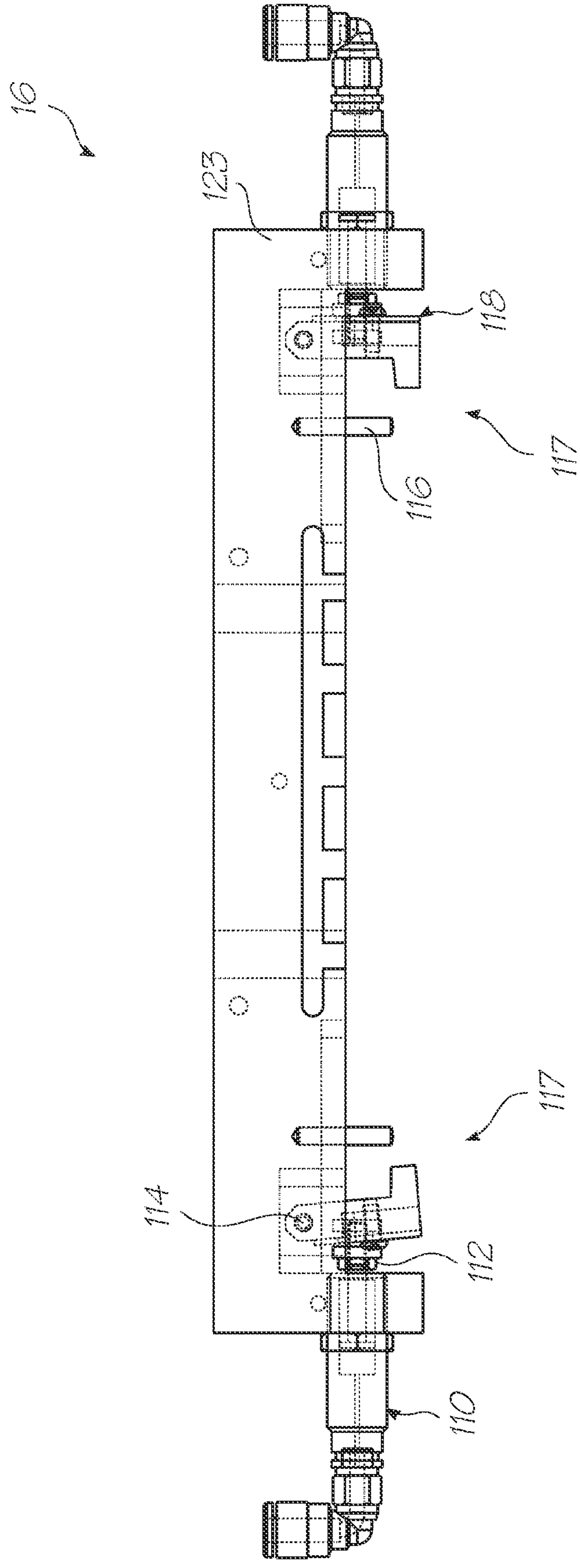
FIG. 6 shows a side diagrammatic view of a retaining assembly, in accordance with one embodiment of the invention, for retaining a carrier to a support assembly of the tester of FIG. 1.
Figure 7:
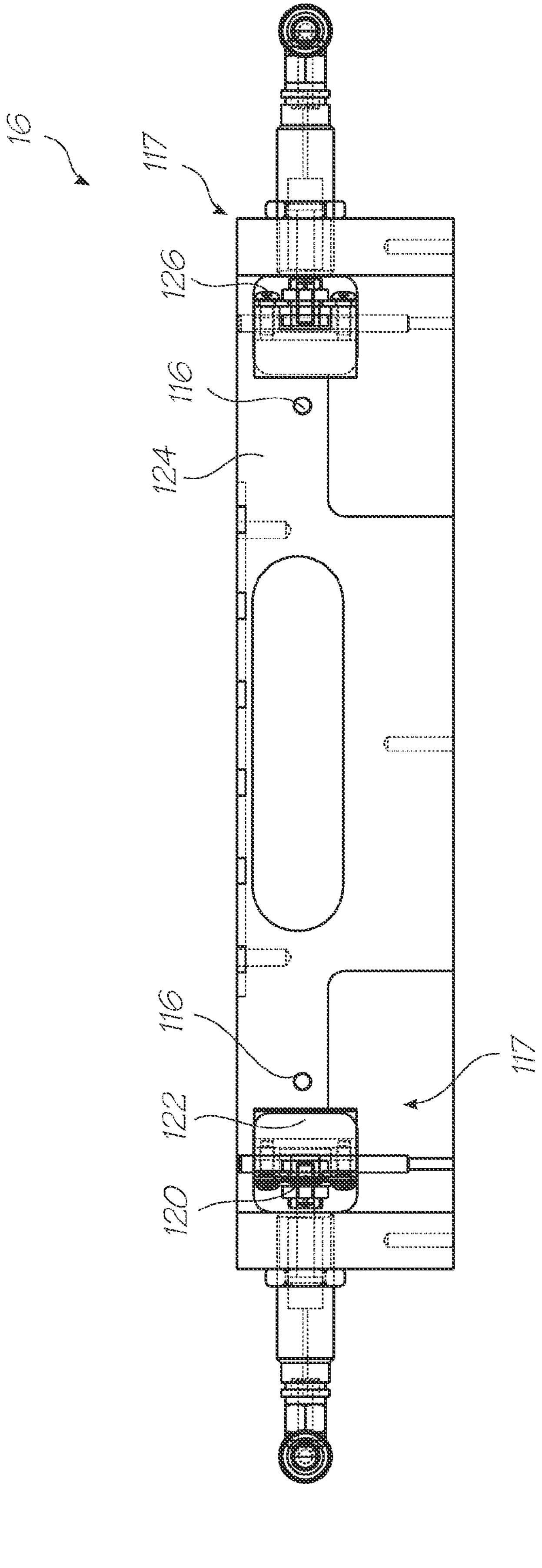
FIG. 7 shows a top diagrammatic view of the retaining assembly of FIG. 6.

FIGS. 6 and 7 show an embodiment of the retaining assembly 16 including the test stage 21, which includes the retaining mechanism or clamp mechanism 117. The test stage 21 is mounted on the table assembly 23 of the support structure 17, as described above.

The test stage 21 includes a fixture 124 shaped and dimensioned to receive and locate the carrier. Also included is the retaining mechanism or clamping mechanism 117 arranged on the fixture 124, the clamping mechanism 117 having at least one clamp assembly 118 for clamping the carrier to the test stage 21. It is to be appreciated that controller 72 is responsible for controlling operation of the clamping mechanism 117 via suitable pneumatic components and circuits, described below.

The fixture 124 includes a base member 123 and dowel pins 116 extending from the base member 123 to facilitate location of the carrier on the fixture 124. The dowel pins 116 are shaped and dimensioned to be receivable in complementary apertures defined by the carrier. The base member 123 is elongate and the clamping mechanism 117 includes the two opposing clamp assemblies 118 located on respective ends of the base member 123, as shown.

Each clamp assembly 118 includes a piston and cylinder arrangement 112 mounted on the base member 123, and a clamp plate 122 having a clamp finger pivotally mounted on the base member 123 to be pivoted into and out of a clamping position with the piston and cylinder arrangement 112. The clamp plates 122 are mounted by means of pivot pins 114, as shown. Each piston and cylinder arrangement 112 includes an actuator coupling 120 and button head caps 126 to facilitate actuation of the clamp arrangement 112 via a pneumatic supply.

The clamp assembly 118 also includes a pneumatic coupling 110 for coupling the piston and cylinder arrangement 112 to a pressurized air supply in order to actuate the retaining assembly 16. As mentioned above, the controller 72 in the form of a programmable logic controller (PLC) is configured to control the pressurized air supply and thus operation of the piston and cylinder arrangements 112. The pneumatic components of the tester 10 are discussed in more detail below.

Pneumatic Components

The tester 10 features general pneumatic components to facilitate the PLC's 72 control of the retaining assembly 16 and displacement mechanism 19. These pneumatic components include the pressure indicators 26 and 28, described above. The pneumatic components typically include a main supply regulator, such as an SMC AR2000-02 regulator, to control the overall pneumatic system pressure. A mechanical shut-off valve, such as an SMC VM430-01-00 three port mechanical valve, is provided as a mechanical shut-off of the pneumatic system. A micro-mist separator is included to remove impurities and drain moisture from the pneumatic system of the tester 10. The inventor has found the SMC AFD20-02-C model suitable for this application.

These components are linked to a number of body-ported, cassette type solenoid valves to control the displacement assembly 19 and the clamps 117 of the test stage 21, described above. The valves are controlled by the PLC 72, such as SMC SY3160 solenoid valves, which are 24V DC with 6mm pneumatic pipe fittings.

The test stage 21 uses two single-acting, single rod, spring return pin cylinders for the piston and cylinder arrangements 112, described above, to clamp the carrier to the test stage 21. The displacement mechanism 19 uses an SMC MGPM series double-acting compact guide cylinder to actuate the stage 21 into contact with the probe 18 of the testing circuitry. The displacement mechanism 19 typically includes two SMC D-Y7P general purpose auto switches to indicate limits of travel for displacement of the test stage 21. To assist the PLC 72 in controlling the necessary pressure for the test stage 21 and displacement assembly 19, an SMC electronic pressure switch is generally also included.

A third switch may further be used to initiate operation of the barcode scanner 24 as the stage 21 is lifted towards the probe 18. In effect, the stage 21 activates such a third switch when it is lifted. The inventor has found the Handheld Products 3800LR barcode scanner to be suitable for this application.

The pneumatic components typically also include a sintered silencer to reduce noise of exhausted air from the pneumatic system. An SMC AN01-01 sintered silencer may be suitable for this application. The pneumatic components are described below with more reference to FIG. 14.

Diagnostic Probe Assembly

Figure 4:
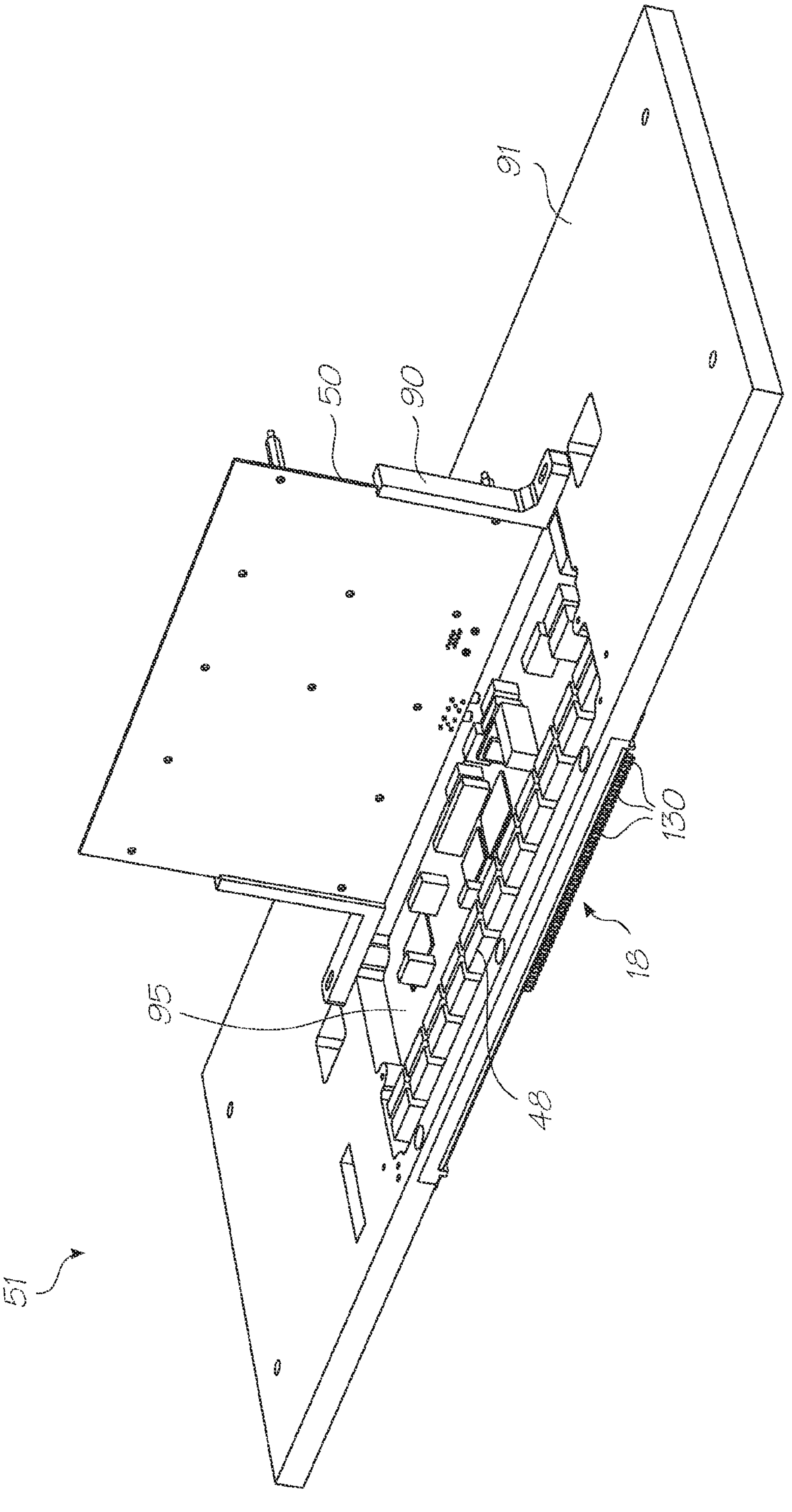
FIG. 4 shows a diagnostic probe assembly, in accordance with one embodiment of the invention, of the tester of FIG. 1.
Figure 5:
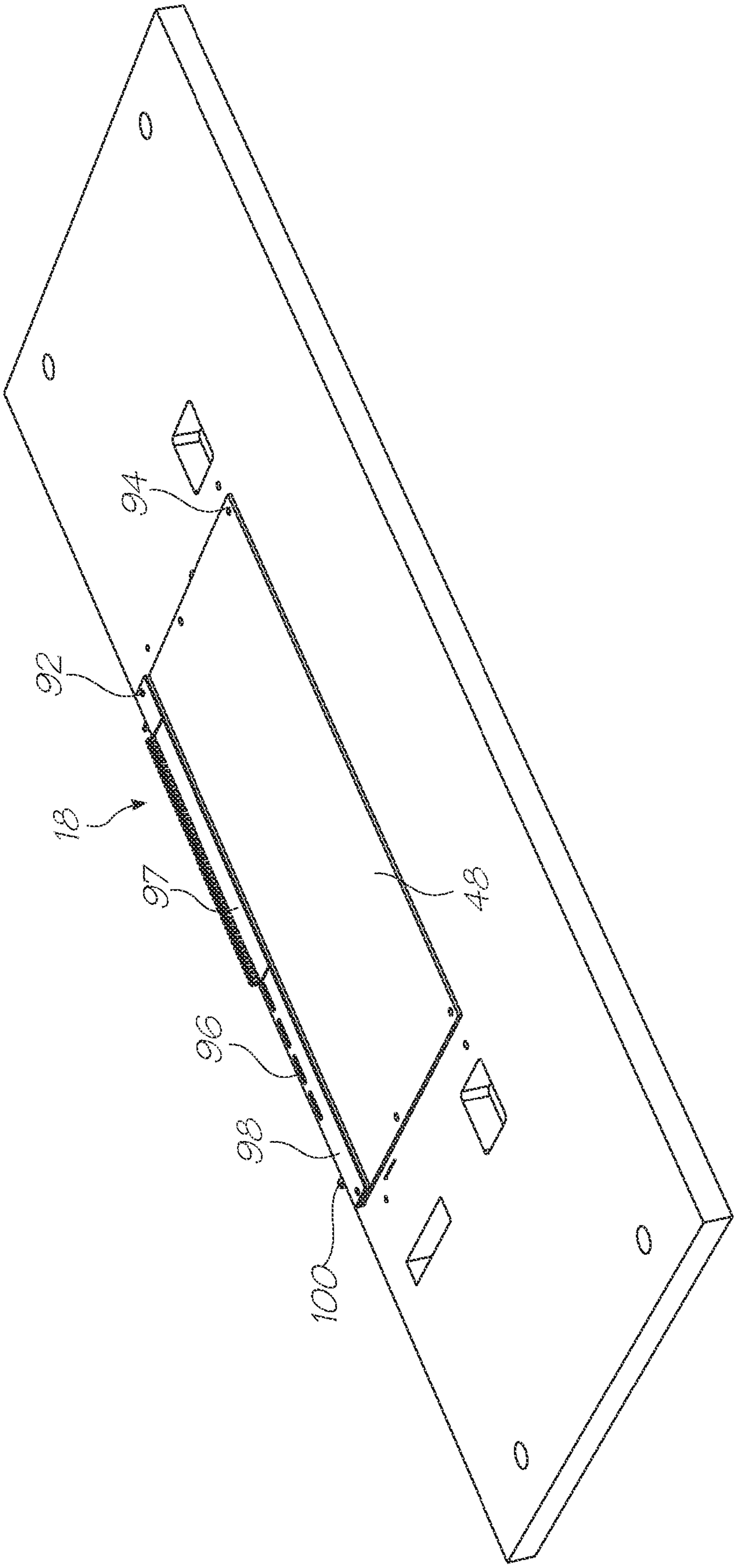
FIG. 5 shows a probe interface of the assembly shown in FIG. 4.

FIGS. 4 and 5 show a diagnostic probe assembly 51 of the tester 10. The diagnostic probe assembly 51 includes testing circuitry and is used to diagnose the printhead integrated circuits on the carrier. The probe assembly 51 includes a support assembly 91 in the form of a support plate with support brackets 90. The support brackets 90 support the controller board 50 on the support assembly 91, which defines an aperture for receiving the probe interface arrangement 18, as shown.

The controller board 50 generally includes a processor (not shown) which is configured to generate test signals for testing the printhead integrated circuits on the carrier. Routing or multiplexer board 48 is mounted on the support assembly 91, and is arranged in operative signal communication with the controller board 50. The routing board 48 is configured to multiplex the generated test signals to respective printhead dies of the printhead integrated circuits on the carrier.

The probe interface 18 is mounted on the support assembly 91 via securing screws 92, as shown. The probe interface 18 is arranged in operative signal communication with the routing board 48, with the probe interface 18 being configured to relay multiplexed test signals to and from the respective dies of the printhead circuitry on the carrier when the test stage 21 is in contact with the probe 18.

The routing board 48 typically includes a reset board 95 having a converter thereon (not shown) for converting the test signals to suitable printhead integrated circuits electrical signals. The converter is configured to generate a reset signal to facilitate multiplexing of the test signals to the respective dies of the printhead integrated circuits. Probe interface 18 further defines a number of probe contacts 130 which engage similar contacts of the printhead integrated circuits on the carrier.

The routing board 48 generally includes board connectors for receiving the controller board 50 and an adaptor board 97, the routing board 48 having power circuits for supplying said controller and adaptor boards 50 and 97, respectively, with electrical power. In essence, the adaptor board 97 includes adaptor circuitry configured to engage the printhead integrated circuits and to provide the electrical and physical interface with the printhead integrated circuits.

The probe interface 18 also includes a push bar 98 to provide rigidity and mechanical support to the probe interface 18 during engagement of the interface 18 with the printhead integrated circuits on the carrier.

The processor of the controller board 50 is configured to generate test signals suitable for one of a group of tests consisting of: a gross Idd test, an Ipos test, a protection diode voltage threshold test, a wirebond continuity test, a leakage current test, a signal input voltage threshold test, a signal output voltage test, and a test for functional vectors of the printhead integrated circuits.

The controller board 50 comprises signal generation and testing circuitry, with the adaptor board 97 forming a tester board having converter or reset board 95 forming a multiplexer board which is interposed between the controller board 50 and the adaptor board 48. The signal generation and testing circuitry includes reset board 95 for generating reset signals required for multiplexed printhead integrated circuits. The reset board 95 is configured to rout test and control signals between the adaptor board 48 and the printhead integrated circuits via probe 18.

Figure 8:
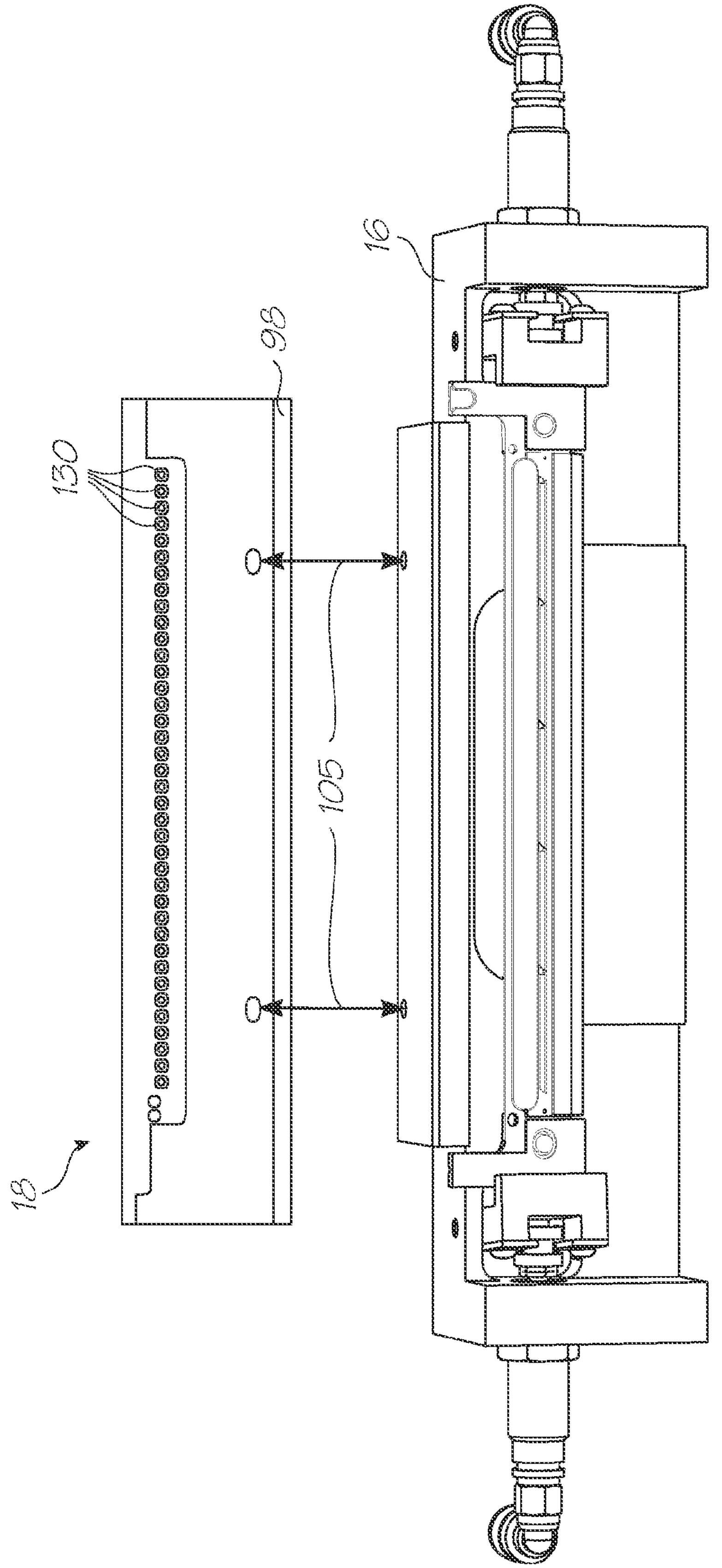
FIG. 8 shows a schematic alignment of a carrier retained in the retaining assembly and test probe assembly of FIGS. 6 and 4, respectively.

FIG. 8 shows operative alignment of the test stage 21, operatively retaining the carrier, with the probe 18 of the test circuitry. If the test probe 18 is misaligned with the carrier, faulty readings may result. To ensure proper alignment, temporary dowels (indicated at 105) are inserted into the test stage 16 to align with corresponding holes or locating tangs 101 in the push bar 98 of the test probe 18, as shown. The push bar 98 and test probe contacts 130 are also shown.

Testing System

Figure 9:
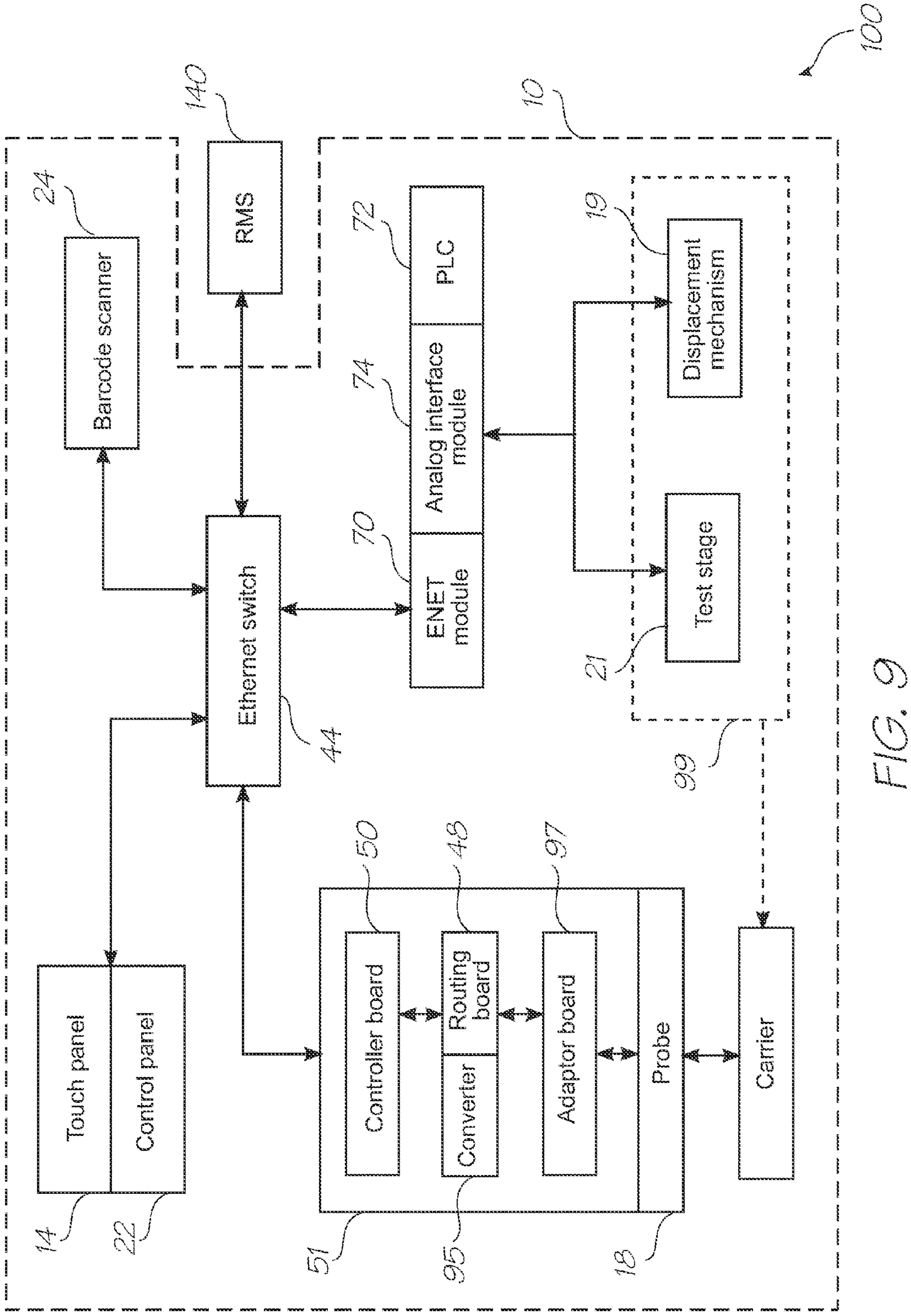
FIG. 9 shows a schematic layout of a test system for printhead integrated circuits, in accordance with one embodiment of the invention.

With reference now to FIG. 9, there is shown a system 100 for testing the printhead integrated circuits using the tester 10, as described above. In general the system 100 includes the tester 10 along with remote monitoring system (RMS) 140, mentioned above.

The system 100 includes the tester 10, which is arranged in signal communication with the RMS 140. Some of the major functional components of the tester 10 are shown in schematic representation. The Ethernet switch 44 forms a communications hub for interfacing the respective components of the tester 10 as well as the RMS 140, as shown.

The tester 10 includes PLC 72 with associated analog interface module 74 and network module 70. The analog interface module 74 forms an interface between the PLC 72 and the solenoid valves, which control the pneumatic components of the test stage 21 and the displacement mechanism 19, as described above. The network module 70 forms the network interface between the PLC 72 and the rest of the components indicated in FIG. 9.

The remote monitoring system or RMS 140 forms a local computational device which has a communications link, via the Ethernet switch 44, to the computational device or RMS 140. As described above, the tester 10 includes the diagnostic probe assembly 51 which includes testing circuitry operatively connected to the computational device or RMS 140, via the communications link of the Ethernet switch 44. The testing circuitry of assembly 51 is configured to generate integrated circuit test signals to test the printhead integrated circuits.

The adaptor board 97 includes adaptor circuitry operatively connected to the testing circuitry on the controller board 50 and is configured to provide an electrical and physical interface with the integrated circuits on the carrier via probe 18 having contactors 130, as described above.

The routing board 48 includes routing circuitry interposed between the testing circuitry on the controller board 50 and adaptor circuitry on the adaptor board 48 to rout the test signals to respective integrated circuits on the carrier. The pneumatic test stage 21 and displacement mechanism 19 can together be regarded as a handling mechanism 99 for retaining and manipulating the carrier on which the integrated circuits is positioned. The PLC or controller 72 is operatively connected to this handling mechanism 99, as described above, for controlling operation thereof. The PLC 72 is further connected to the communications device, in the form of the Ethernet switch 44, for supervision by the computational device or RMS 140.

It is to be appreciated that the RMS or computational device 140 may be a PC with a graphic user interface for displaying test results of the carrier printhead integrated circuits to an operator. As such, the RMS or local communications device 140 is typically programmed to define a test server for communication with the testing circuitry of the assembly 51 via the PLC 72.

The RMS 140 performs remote monitoring of the tester 10. The barcode and test result of each carrier tested by the tester 10 are sent to the RMS 140 for quality and assurances control. The RMS 140 can also communicate with the PLC 72 to provide operating parameters and instructions to control the tester 10.

Method for Testing the Carrier

Figure 10:
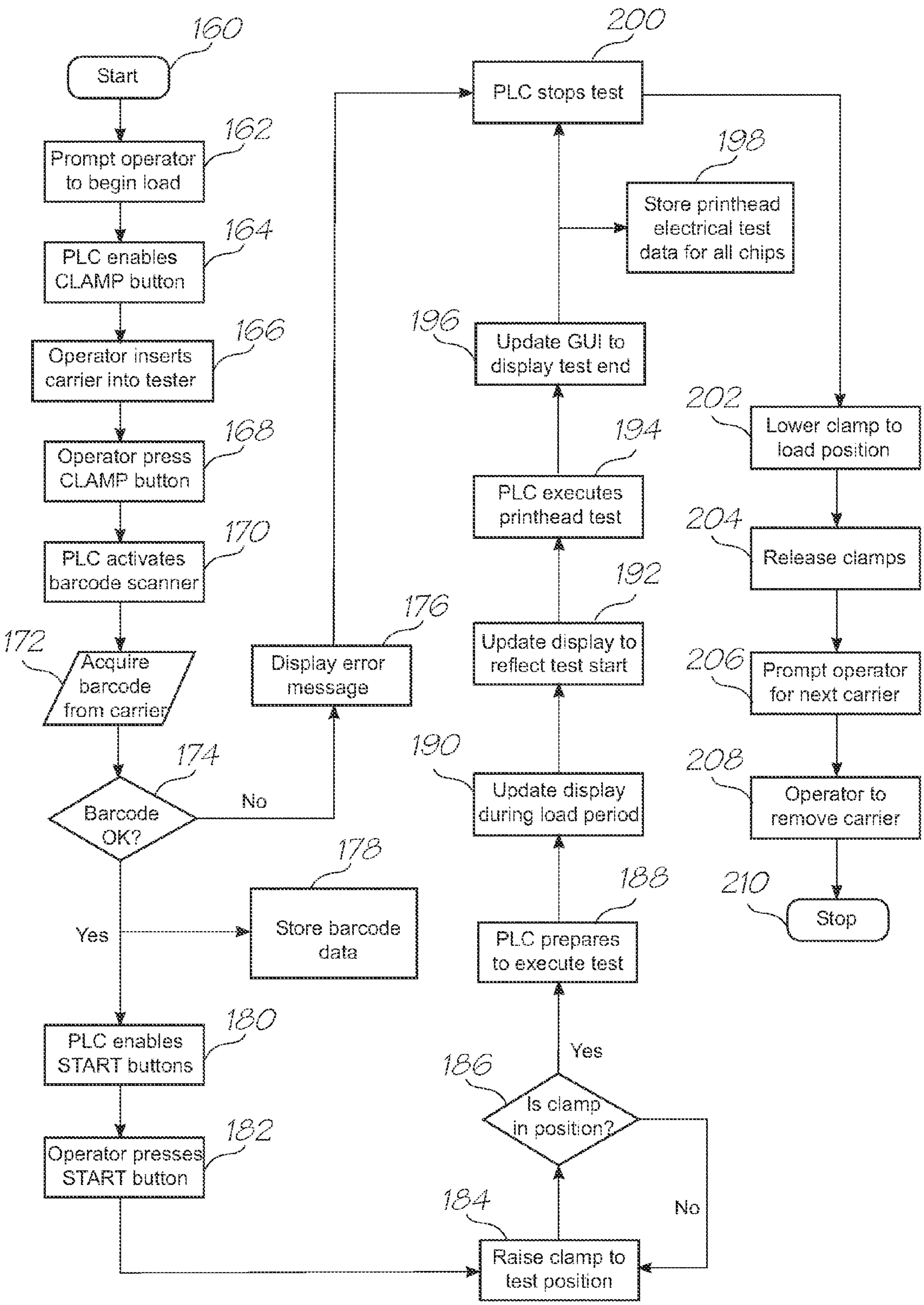
FIG. 10 shows a flow diagram for method steps for testing printhead integrated circuits with the tester of FIG. 1, in accordance with one embodiment of the invention.

FIG. 10 shows possible method steps performed in using the tester 10 to test printhead integrated circuits on the carrier. It is to be appreciated that reference to a reference numeral representing a particular method step refers to a respective block indicated by such reference numeral in the accompanying drawing. As such, the method included in the invention is not limited or constrained to particular method steps referred to in this manner. A skilled person will understand that further methods are possible under this invention which might exclude some of these steps or include additional steps.

In one embodiment, the method commences at block 160, where the operator is prompted via the touch panel 14 by the PLC 72 to load a carrier into the test stage 21 (block 162). The PLC 72 also enables the clamp button on the operator control panel 22 (block 164). The operator can then load the carrier into the test stage 21 (block 166) and press the clamp button, which instructs the PLC 72 to actuate the clamping mechanism 117 to secure the carrier to the fixture 124.

Once the carrier has been clamped, the PLC 72 can activate the barcode scanner 24 to scan the carrier's barcode (blocks 170 and 172, respectively). If the PLC 72 successfully scans the barcode, the barcode is stored and sent to the RMS 140, as described above. The PLC 72 then enables the start button, to allow testing of the carrier to continue. If there is a problem with the barcode, the PLC 72 displays an error message via the touch panel 14, and may also notify the RMS 140. No test on the carrier is performed, as explained below. This is indicated by blocks 174, 176, 178 and 180).

Assuming that the barcode was successfully scanned, the operator proceeds to press the start buttons, described above (block 182). The PLC 71 then actuates the displacement mechanism 19 to raise the test stage 21 with the carrier secured thereon to the probe 18 (block 184). The probe contacts the printhead integrated circuits on the carrier so that the testing can take place. Once the clamp of the test stage is in position (block 186), the PLC prepares (block 188) to execute a test routine (block 190).

In one embodiment, the test routine typically includes software instructions which the PLC 72 loads. The RMS 140 may also supply such test routine software to the PLC 72 via the communications link 44. The PLC 72 displays a message to the operator via the touch panel 14 that testing is about to commence (block 190). Once the test routine has been loaded by the PLC 72, the PLC 72 displays a message to the operator via the touch panel PC 14 that the test is underway (block 192). The touch panel PC 14 typically executes software instructions to display a graphical user interface (GUI) for the operator.

The PLC 72 then executes the printhead test routine on the integrated circuits via the diagnostic assembly 51 (block 194), described above. The test routine includes the controller board 50 generating test signals to perform any or all of the following types of electrical tests: a gross Idd test, an Ipos test, a protection diode voltage threshold test, a wirebond continuity test, a leakage current test, a signal input voltage threshold test, a signal output voltages test, and a test for functional vectors.

As the different tests are finished, the touch panel 14 displays the results for the operator via the GUI. The PLC 72 stores the results (block 198) and can also send the results to the RMS 140. When all the tests are finished, the PLC stops the test, shown at block 200. When the testing is done, the PLC 72 lowers the test stage 21 with clamp 117 to a load position out of contact with probe 18 (block 202), and releases the clamp (block 204) so that the carrier can be removed.

The GUI of the touch panel 14 may also display a message that the tests are finished (block 196) and prompt the operator to load the next carrier (block 206). The operator removes the carrier (block 208) at the end of the testing cycle (block 210). The method steps are repeated for the next carrier.

Circuit Diagrams

Figure 11:
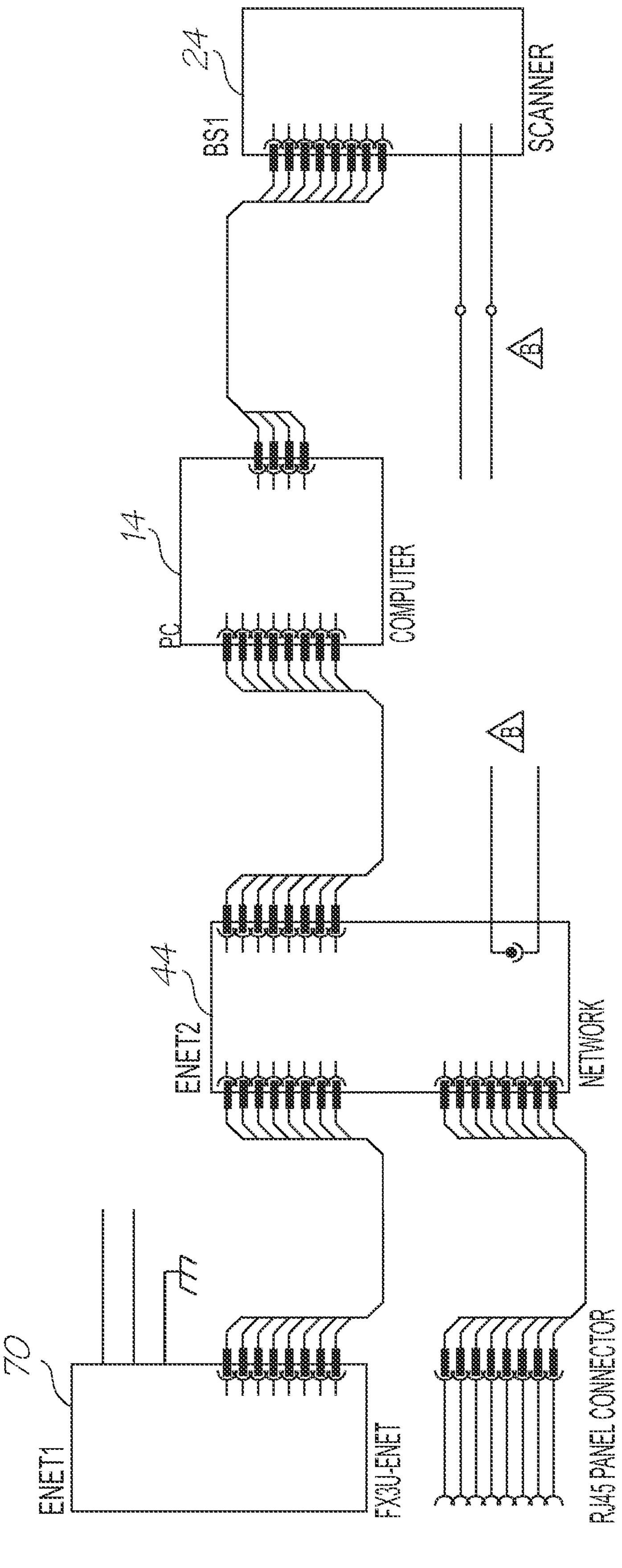
FIG. 11 shows a circuit diagram of network components of the apparatus of FIG. 1.

FIGS. 11 to 14 shows circuit diagrams of the controller components described above. FIG. 11 shows the interconnection between the network communication module 70, the Ethernet switch 44, touch panel computer 14, and barcode scanner 24.

Figure 12:
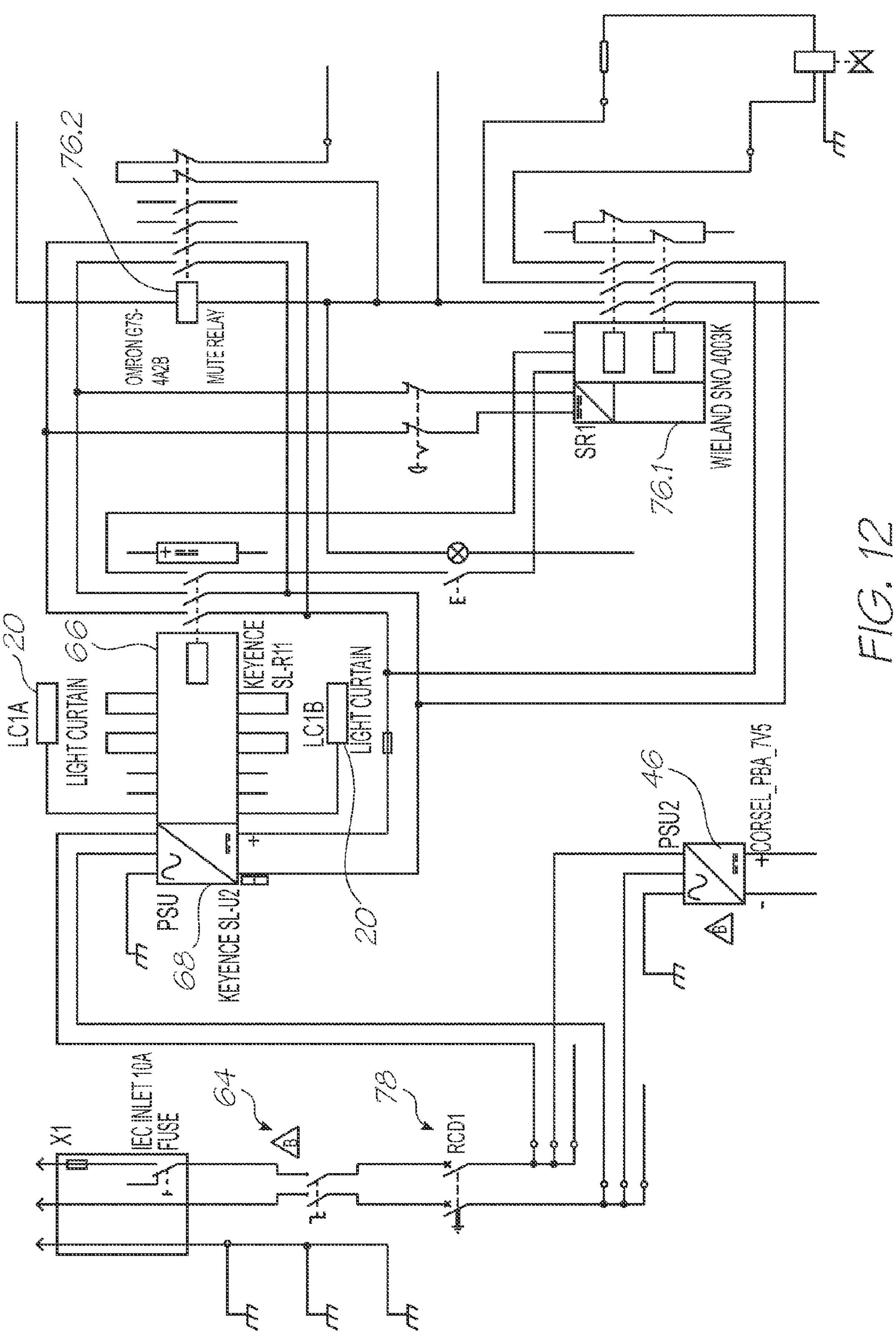
FIG. 12 shows a circuit diagram of electrical and safety components of the apparatus of FIG. 1.

FIG. 12 shows the interconnection between mains power isolation switch 64, residual current circuit breaker 78, light curtain power supply 68, light curtain safety relay 66, DC power supply 46 and safety relays 76. As described above, safety relays 76 include the two safety relays 76.1 and 76.2, as indicated. Positions of the emergency stop and reset buttons are also indicated.

Figure 13:
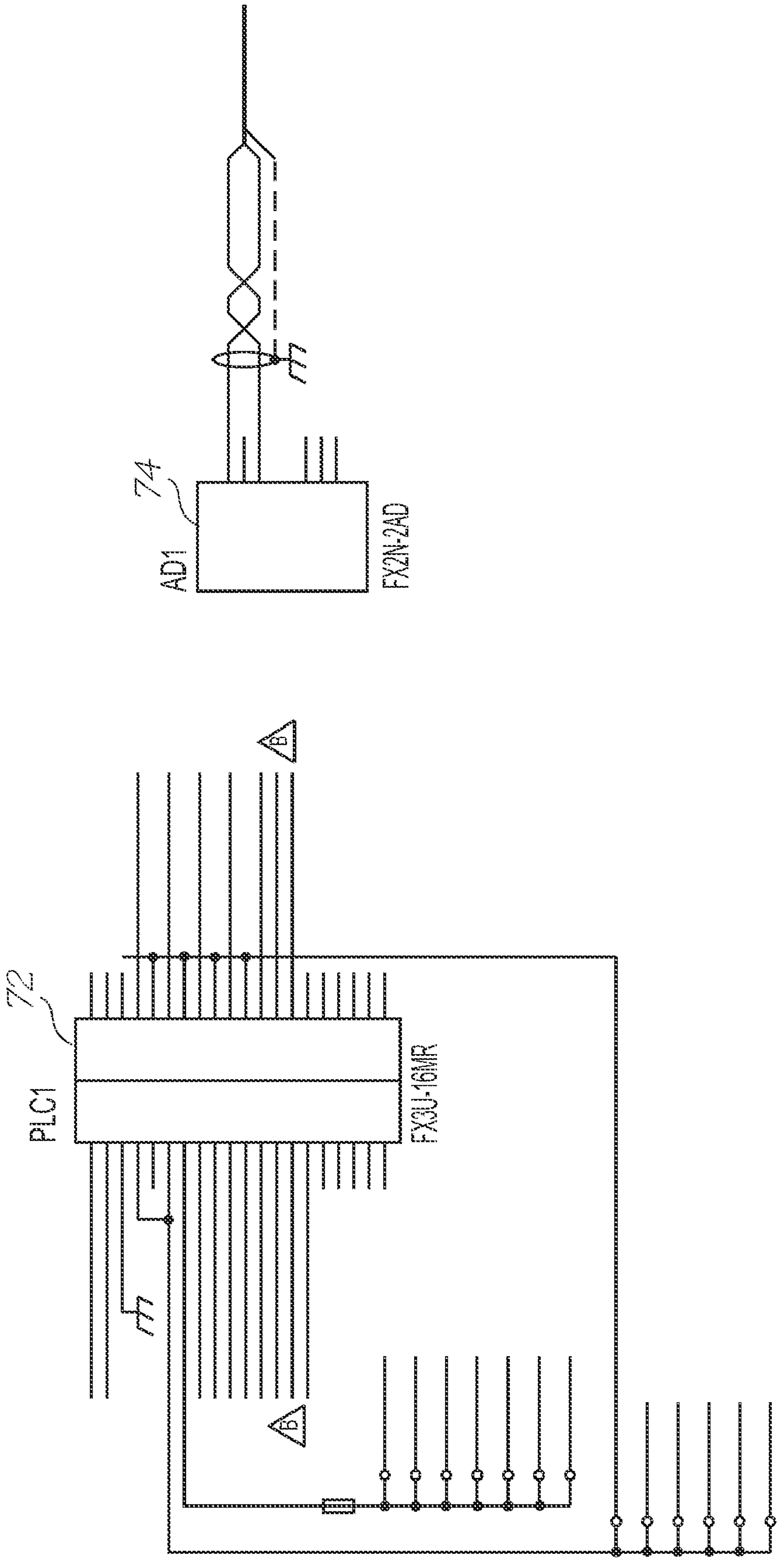
FIG. 13 shows a circuit diagram for a controller of the apparatus of FIG. 1.
Figure 14:
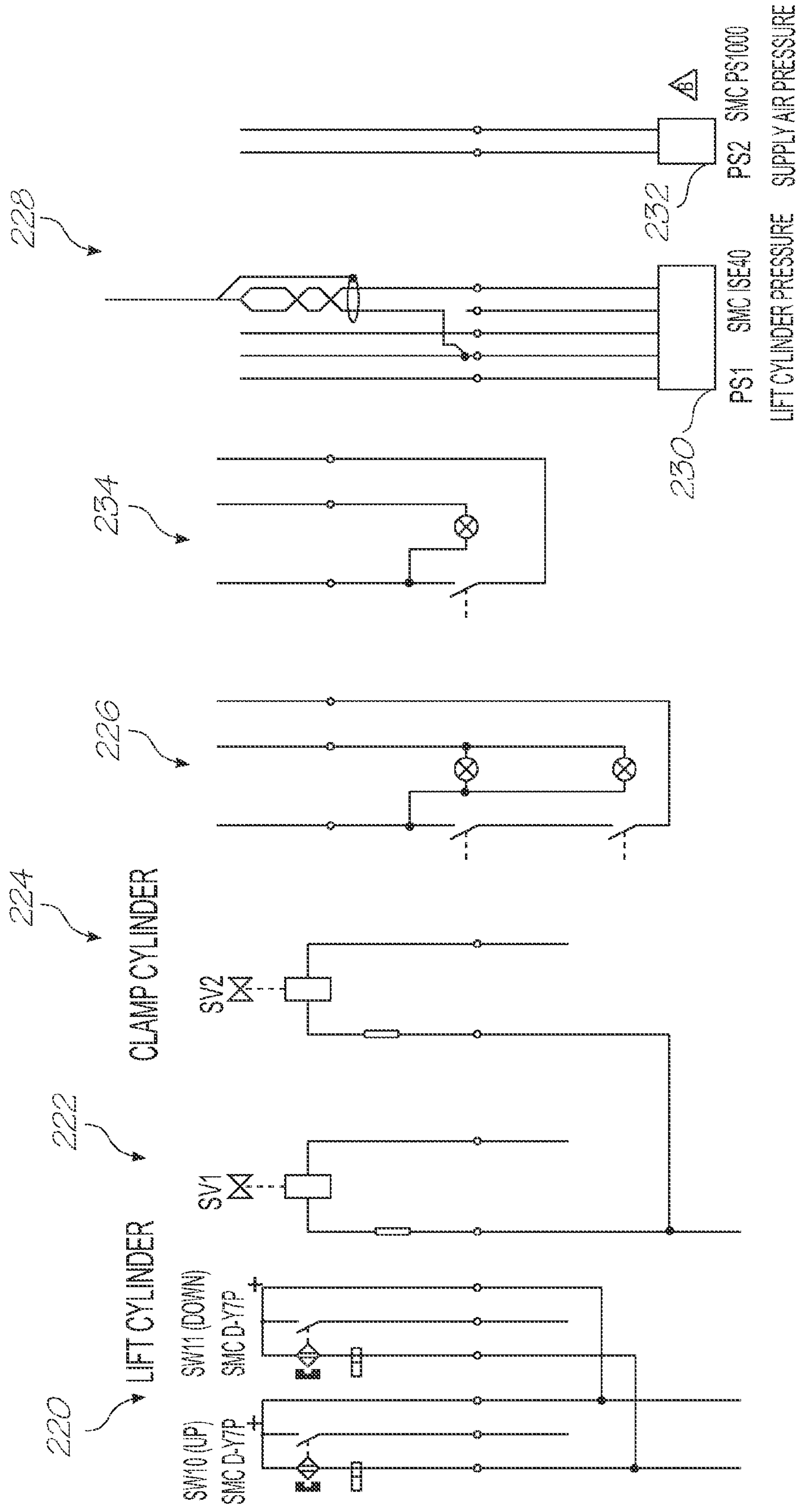
FIG. 14 shows a circuit diagram for interconnecting the electrical components of the apparatus with pneumatic components.

FIG. 13 shows the PLC 72 with analog interface module 74. FIG. 14 shows further pneumatic and button interconnections. Auto switches 220 are shown, as mentioned above, to limit travel of the displacement assembly 19, along with solenoid valve 222 responsible for actuating the displacement assembly 19. The solenoid valve 224 is responsible for actuating the clamping mechanisms 117, with start buttons 226 and clamp button 234 also shown. Digital pressure sensor 230 shows system pneumatic pressure, with system pressure switch 232 indicated.

The interconnections shown in the circuit diagrams of FIGS. 11 to 14 are not described in detail, but will be apparent to the skilled person.

The invention claimed is:

1. A diagnostic probe assembly for a tester which is used to diagnose printhead integrated circuits, the probe assembly comprising:

a support assembly;

a controller board mounted on the support assembly and having a processor configured to generate signals for testing a printhead integrated circuit;

a routing board mounted on the support assembly and in operative signal communication with the controller board, the routing board configured to multiplex the generated signals for respective dies of the printhead integrated circuits;

a probe interface mounted on the support assembly and in operative signal communication with the routing board, the probe interface configured for relaying the multiplexed test signals to and from the respective dies;

in which the probe interface includes an adaptor board having a converter for converting the signals to printhead integrated circuit electrical signals; and wherein the routing board includes board connectors for receiving the controller board and adaptor board, the routing board having power circuits for supplying said controller and adaptor boards with electrical power.

2. The probe assembly of claim 1, wherein the converter is configured to generate a reset signal to facilitate multiplexing of the signals to the respective dies of the printhead integrated circuits.

3. The probe assembly of claim 1, wherein the probe interface includes a push bar to provide rigidity and mechanical support to the interface during engagement of the interface with the printhead integrated circuits.

4. The probe assembly of claim 1, wherein the support assembly includes a support plate and brackets extending from the support plate, the controller board being fixed to the brackets and the routing board being fixed to the support plate, which defines an aperture for access to the probe interface.

5. The probe assembly of claim 1, wherein the processor of the controller board is configured to generate test signals suitable for one of a group of tests consisting of: a gross Idd test, an Ipos test, a protection diode voltage threshold test, a wirebond continuity test, a leakage current test, a signal input voltage threshold test, a signal output voltage test, and a test for functional vectors.

* * * * *